(12) United States Patent
Lee et al.

(10) Patent No.: US 7,839,690 B2
(45) Date of Patent: Nov. 23, 2010

(54) ADAPTIVE ERASE AND SOFT PROGRAMMING FOR MEMORY

(75) Inventors: Shih-Chung Lee, Yokohama (JP); Gerrit Jan Hemink, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 75 days.

(21) Appl. No.: 12/332,646

(22) Filed: Dec. 11, 2008

(65) Prior Publication Data
US 2010/0149881 A1   Jun. 17, 2010

(51) Int. Cl.
G11C 16/04     (2006.01)
(52) U.S. Cl. ............... 365/185.18; 365/185.19; 365/185.22; 365/185.24; 365/185.29
(58) Field of Classification Search ............ 365/185.18, 365/185.19, 185.22, 185.24, 185.29
See application file for complete search history.

(56) References Cited

U.S. PATENT DOCUMENTS

| | | | |
|---|---|---|---|
| 5,270,979 A | 12/1993 | Harari | |
| 5,909,390 A | 6/1999 | Harari | |
| 6,603,682 B2 * | 8/2003 | Keays | 365/185.33 |
| 6,639,844 B1 * | 10/2003 | Liu et al. | 365/185.3 |
| 6,901,010 B1 * | 5/2005 | Hamilton et al. | 365/185.22 |
| 7,200,708 B1 | 4/2007 | Kreifels | |
| 7,310,270 B2 | 12/2007 | Tanaka | |
| 7,339,834 B2 | 3/2008 | Lutze | |
| 2002/0126535 A1 | 9/2002 | Roohparvar | |
| 2004/0027901 A1 | 2/2004 | Shiga et al. | |
| 2006/0044919 A1 | 3/2006 | Taoka et al. | |
| 2008/0137409 A1 | 6/2008 | Nakamura et al. | |
| 2008/0158997 A1 | 7/2008 | Hemink | |
| 2008/0165585 A1 | 7/2008 | Surico | |
| 2008/0198660 A1 | 8/2008 | Mokhlesi | |
| 2008/0198662 A1 | 8/2008 | Mokhlesi | |
| 2008/0239822 A1 | 10/2008 | Kosaki | |
| 2008/0266970 A1 | 10/2008 | Lee | |
| 2009/0296475 A1 * | 12/2009 | Hemink et al. | 365/185.17 |

OTHER PUBLICATIONS

International Search Report and Written Opinion of the International Searching Authority dated Dec. 15, 2009 in PCT Application No. PCT/US2009/058002.

* cited by examiner

*Primary Examiner*—Viet Q Nguyen
(74) *Attorney, Agent, or Firm*—Vierra Magen Marcus & DeNiro LLP

(57) ABSTRACT

An erase sequence of a non-volatile storage device includes an erase operation followed by a soft programming operation. The erase operation applies one or more erase pulses to the storage elements, e.g., via a substrate, until an erase verify level is satisfied. The number of erase pulses is tracked and recorded as an indicia of the number of programming-erase cycles which the storage device has experienced. The soft programming operation applies soft programming pulses to the storage elements until a soft programming verify level is satisfied. Based on the number of erase pulses, the soft programming operation time is shortened by skipping verify operations for a specific number of initial soft programming pulses which is a function of the number of erase pulses. Also, a characteristic of the soft programming operation can be optimized, such as starting amplitude, step size or pulse duration.

20 Claims, 15 Drawing Sheets

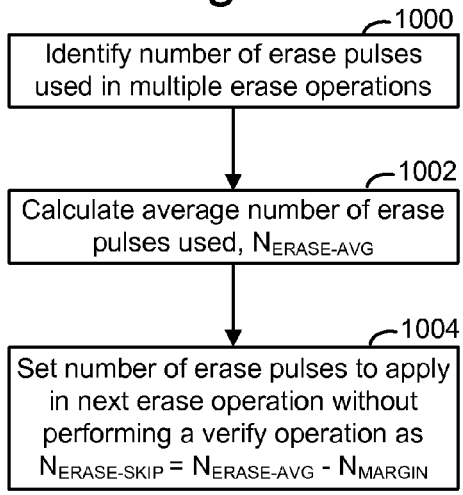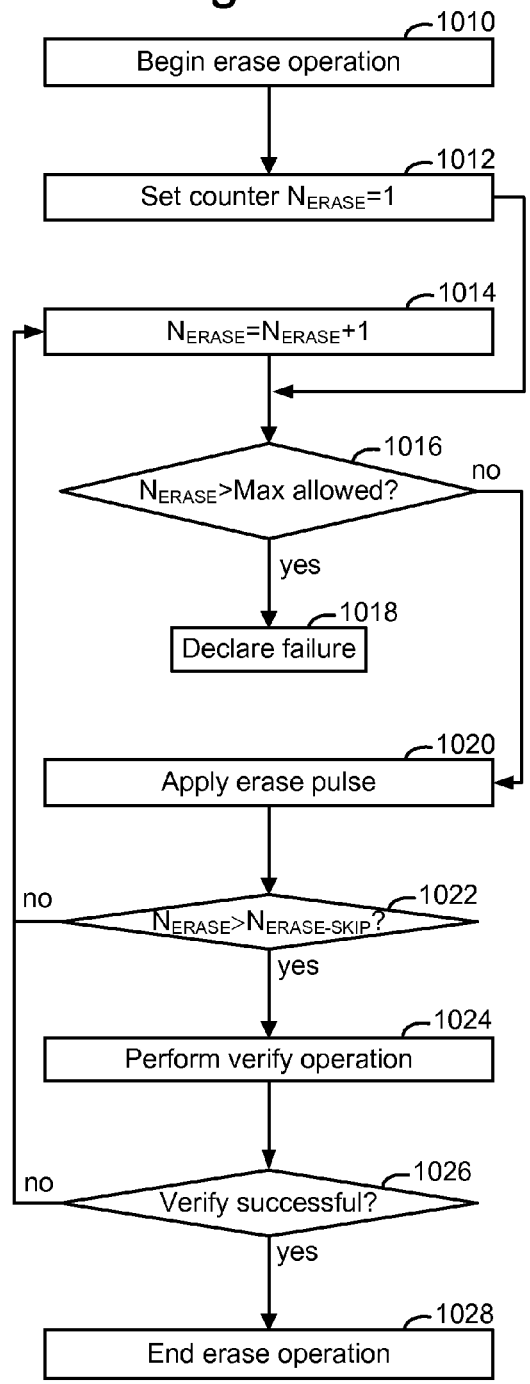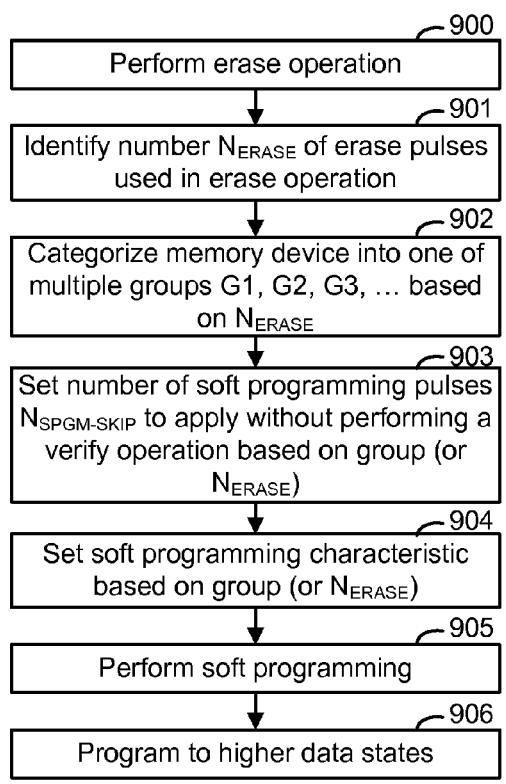

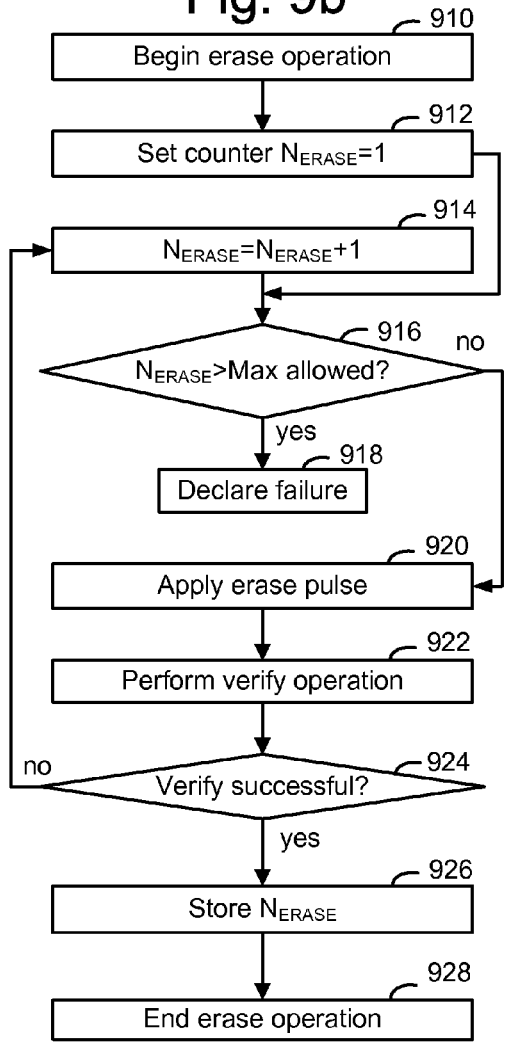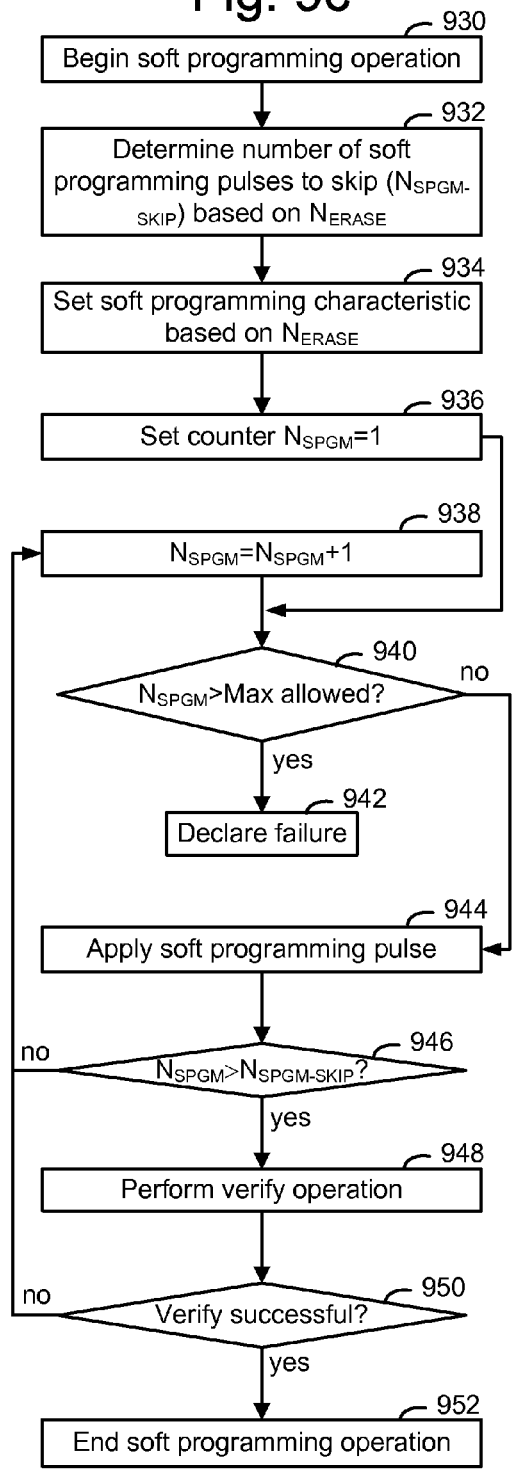

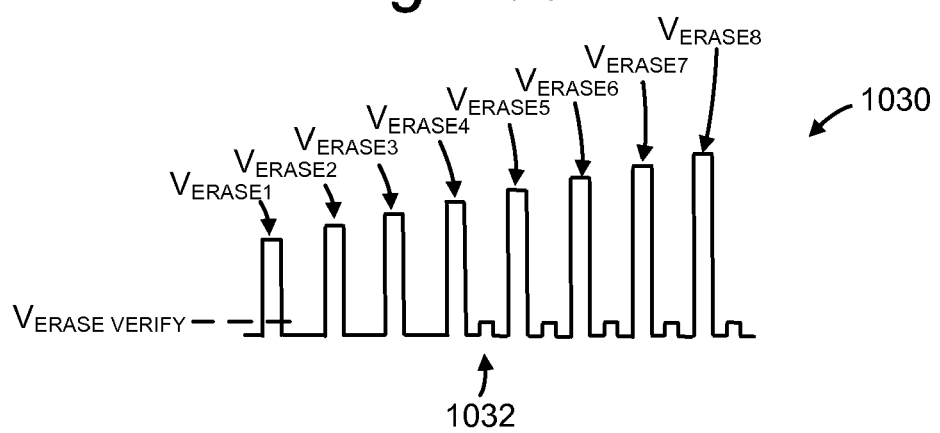

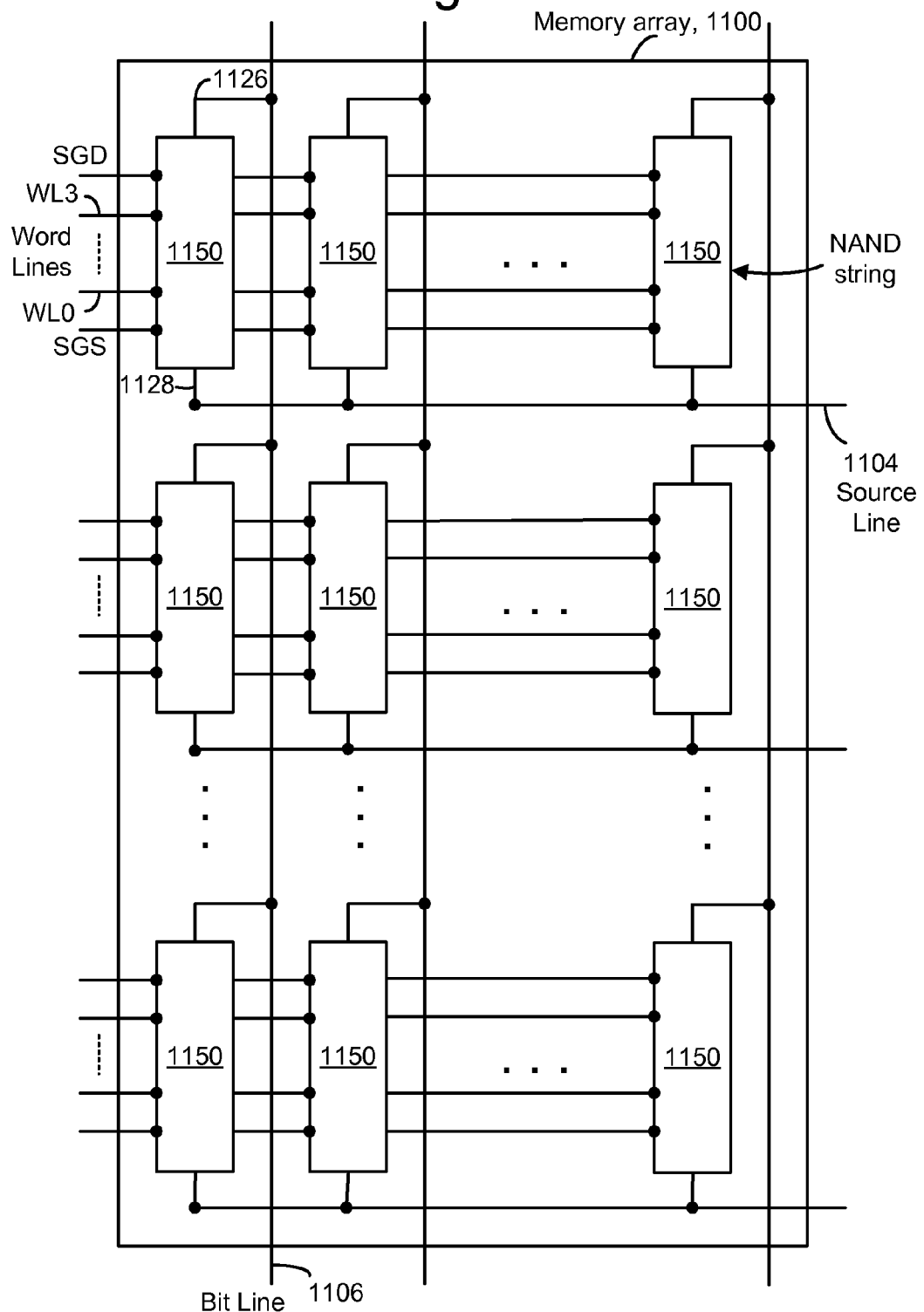

ADAPTIVE ERASE AND SOFT PROGRAMMING FOR MEMORY

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

Before a set of storage elements can be programmed, it is erased in an erase sequence, which includes an erase operation and a soft programming operation. The erase operation includes applying a high substrate voltage which draws the charge out of the floating gates of the programmed storage elements. Subsequently, in the soft programming, the threshold voltage of the storage elements is narrowed and raised to a level which is associated with an erased state. However, the erase sequence can be time consuming.

SUMMARY OF THE INVENTION

The present invention addresses the above and other issues by providing techniques for improving the performance of a memory device during an erase sequence.

In one embodiment, a method for operating non-volatile storage includes applying one or more erase pulses to a set of non-volatile storage elements until a first verify condition is satisfied, and determining a count of the erase pulses applied. The method further includes applying a number $N_{SPGM-SKIP}$ of one or more soft programming pulses to the set of non-volatile storage elements without performing verify operations, where the number $N_{SPGM-SKIP}$ is based on the count. The method further includes subsequently applying one or more additional soft programming pulses to the set of non-volatile storage elements until a second verify condition is satisfied, each soft programming pulse of the one or more additional soft programming pulses is followed by a verify operation.

In another embodiment, a method for operating non-volatile storage includes performing an erase operation of an erase sequence, including applying one or more erase pulses to a set of non-volatile storage elements until an erase verify condition is satisfied, determining a count of the erase pulses applied, and performing a soft programming operation of the erase sequence, including applying one or more soft programming pulses to the set of non-volatile storage elements until a soft programming verify condition is satisfied. A characteristic of the one or more soft programming pulses is set based on the count.

In another embodiment, a method for operating non-volatile storage includes, in a first erase operation, applying one or more erase pulses to a set of non-volatile storage elements until a first verify condition is satisfied. The method further includes determining a count of the erase pulses applied in the first erase operation and, after the first erase operation, performing a second erase operation which includes applying a number $N_{ERASE-SKIP}$ of one or more erase pulses without performing a verify operation, where $N_{ERASE-SKIP}$ is based on the count, and subsequently applying one or more additional erase pulses. Each erase pulse of the one or more additional erase pulses is followed by a verify operation.

In another embodiment, a non-volatile storage includes a set of non-volatile storage elements and one or more control circuits. The one or more control circuits apply one or more erase pulses to a set of non-volatile storage elements until a first verify condition is satisfied, and determine a count of the erase pulses applied. The one or more control circuits further apply a number $N_{SPGM-SKIP}$ of one or more soft programming pulses to the set of non-volatile storage elements without performing verify operations, where the number $N_{SPGM-SKIP}$ is based on the count. The one or more control circuits subsequently apply one or more additional soft programming pulses to the set of non-volatile storage elements until a second verify condition is satisfied. Each soft programming pulse of the one or more additional soft programming pulses is followed by a verify operation.

Corresponding methods, systems and computer- or processor-readable storage devices which have executable code for performing the methods provided herein may also be provided.

BRIEF DESCRIPTION OF THE DRAWINGS

FIG. 1b is an equivalent circuit diagram of the NAND string of FIG. 1a.

FIG. 9a depicts a method for erasing and programming storage elements, including adjusting a soft programming operation based on a number of erase pulses used in an erase operation.

FIG. 9b depicts a method for performing an erase operation, including counting a number of erase pulses used in an erase operation and setting a number of soft programming verify operations to skip in a subsequent soft programming operation.

FIG. 9c depicts a method for performing a soft programming operation by skipping a number of verify operations.

FIG. 10a depicts a method for determining a number of verify operations to skip in an erase operation.

FIG. 10b depicts a method for performing an erase operation, including skipping a number of verify operations.

FIG. 10c depicts a series of erase pulses where the first three pulses are not followed by a verify pulse.

FIG. 11 is a block diagram of an array of NAND flash storage elements.

DETAILED DESCRIPTION

The present invention provides techniques for improving the performance of a memory device during an erase sequence.

Figure 1A:
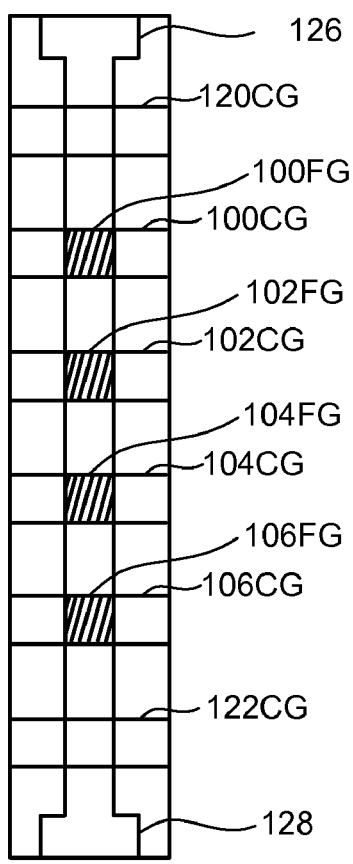
FIG. 1a is a top view of a NAND string.
Figure 1B:
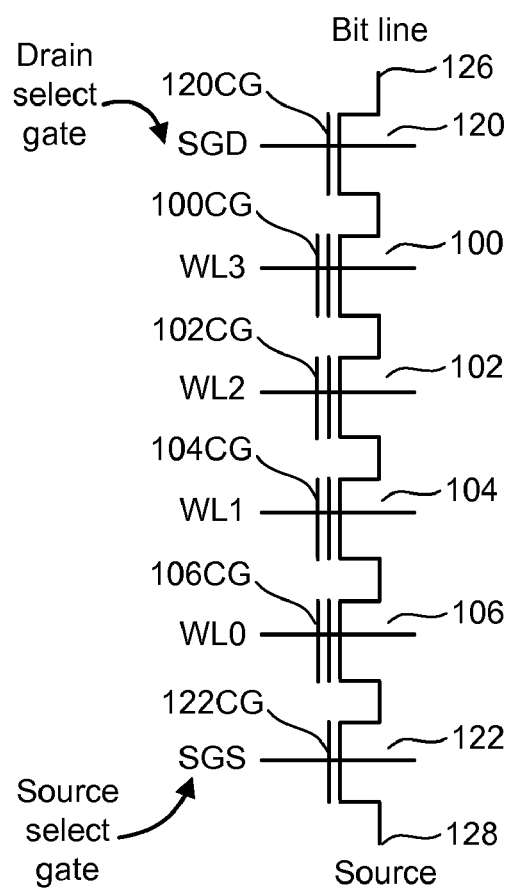

One example of a memory system suitable for implementing the present invention uses the NAND flash memory structure, which includes arranging multiple transistors in series between two select gates. The transistors in series and the select gates are referred to as a NAND string. FIG. 1a is a top view showing one NAND string. FIG. 1b is an equivalent circuit thereof. The NAND string depicted in FIGS. 1a and 1b includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1a and 1b. Select gate 120 is connected to select line SGD. Select gate 122 is connected to select line SGS.

Figure 1C:
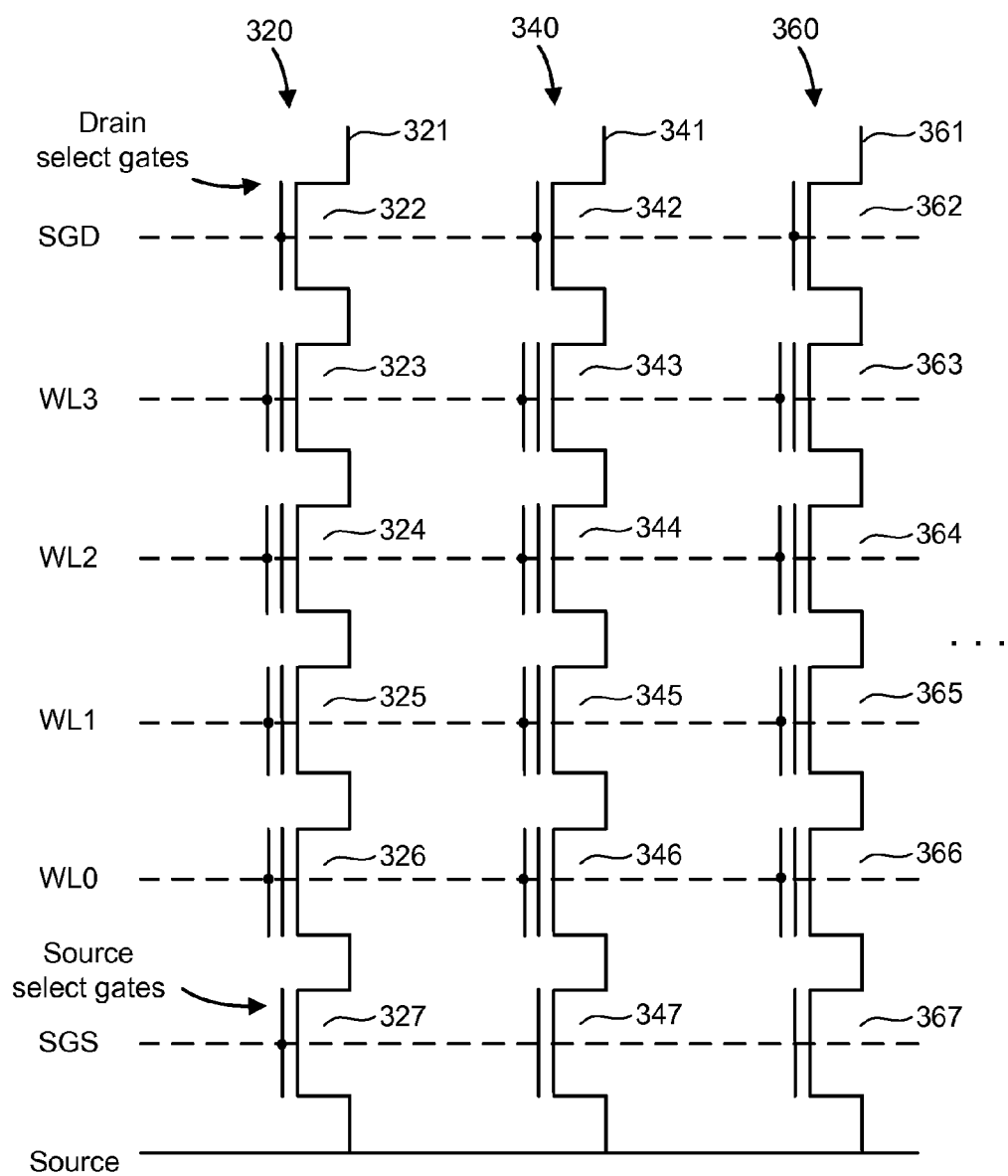
FIG. 1c is a block diagram of an array of NAND flash storage elements.

FIG. 1c is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 1c, the program voltage will also be applied to the control gates of storage elements 344 and 364.

Figure 2:
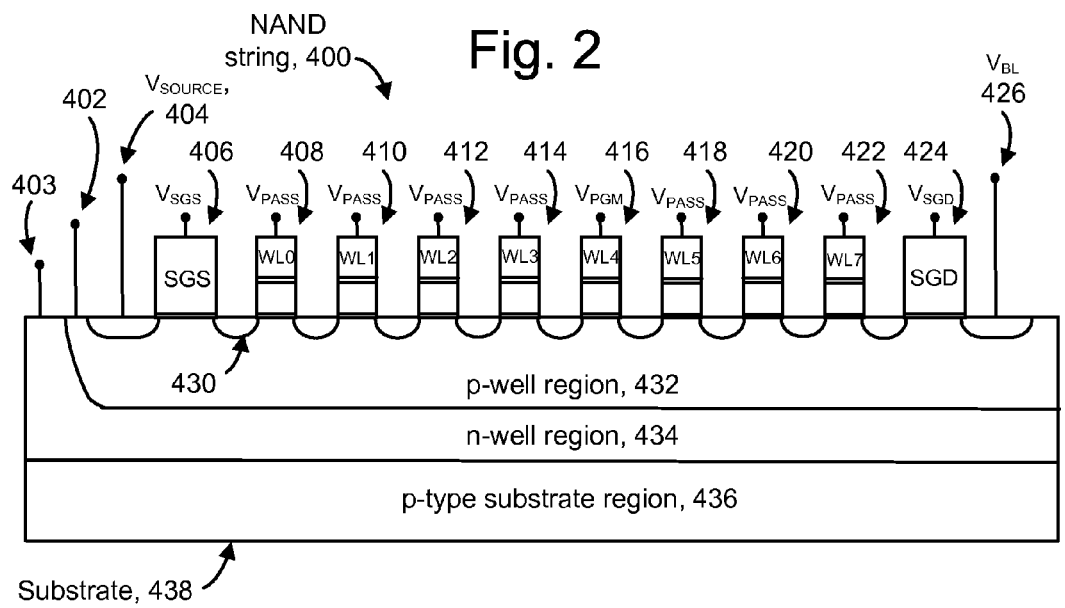
FIG. 2 depicts a cross-sectional view of a NAND string formed on a substrate.

FIG. 2 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 438. A number of source/drain regions, one example of which is source drain/region 430, are provided on either side of each storage element and the select gates 406 and 424. In one approach, the substrate 438 employs a triple-well technology which includes a p-well region 432 within an n-well region 434, which in turn is within a p-type substrate region 436. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 432 via a terminal 402 and/or to the n-well region 434 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. $V_{SGS}$ and $V_{SGD}$ are applied to the select gates 406 and 424, respectively. During an erase operation, high positive voltage pulses are applied to the substrate 436 to draw charge out of the floating gates of the storage elements.

Figure 3:
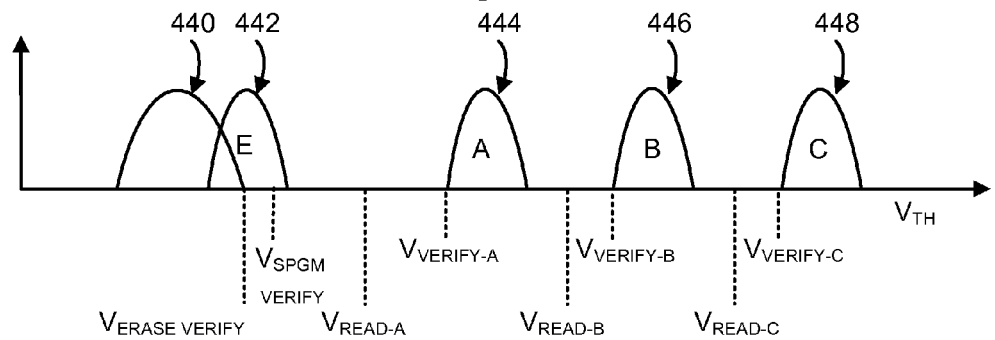
FIG. 3 depicts threshold voltage distributions of an erased state and higher data states.

FIG. 3 depicts threshold voltage distributions of an erased state and higher data states. The x-axis indicates a threshold voltage and the y-axis indicates a number of storage elements. In this example, there are four data states: an erased (E) state 442, an A state 444, a B state 446 and a C state 448. Memory devices with additional data states, e.g., eight or sixteen data states, are expected to become more common as well. An erase sequence includes an erase operation and a soft programming operation. The distribution 440 is realized after the erase operation when storage elements are typically over-erased, past the erase state 442. In the erase operation, one or more erase pulses are applied to the substrate until the threshold voltage of the storage elements being erased transitions below an erase verify level, $V_{ERASE-VERIFY}$. This transition is represented by the arrow pointing to the left. Once the erase operation is completed, the soft programming operation is performed, in which a number of positive voltage pulses are applied to the control gates of the storage elements, such as via a word line, to increase the threshold voltages of some or all of the storage elements in the distribution 440 closer to and below a soft programming (SPGM) verify level, $V_{SPGM-VERIFY}$, to the erased state 442. For example, a certain fraction of the storage elements may be soft programmed to have a $V_{TH}$ above $V_{SPGM-VERIFY}$, leaving other storage elements with a $V_{TH}$ which is close to, but below, $V_{SPGM-VERIFY}$. This transition is represented by the arrow pointing to the right. $V_{SPGM-VERIFY}$ is typically above or equal to $V_{ERASE-VERIFY}$. The soft programming operation advantageously results in a narrow erase state distribution 442. Once the soft programming operation is complete, programming to higher data states can occur, such as to states A, B and C using verify levels $V_{VERIFY-A}$, $V_{VERIFY-B}$ and $V_{VERIFY-C}$, respectively. A subsequent read operation can use the levels $V_{READ-A}$, $V_{READ-B}$ and $V_{READ-C}$.

Note that $V_{ERASE-VERIFY}$ and $V_{SPGM-VERIFY}$ can be the same or different. Also, the set of non-volatile storage elements has the first threshold voltage distribution 440 which is below the erased state 442, at least in part, when the first verify condition of $V_{ERASE-VERIFY}$ is satisfied, and a second, tighter threshold voltage distribution 442 at the erased state when the second verify condition of $V_{SPGM-VERIFY}$ is satisfied.

Figure 4:
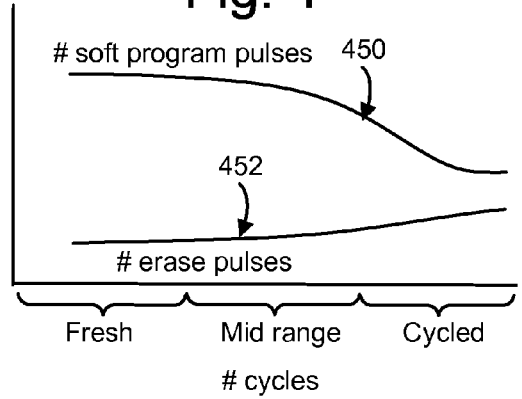
FIG. 4 depicts a behavior of a set of non-volatile storage elements as a function of a number of program-erase cycles.

FIG. 4 depicts a behavior of a set of non-volatile storage elements as a function of a number of program-erase cycles. As a memory device undergoes programming and erase cycles over time, its performance changes. For example, a memory device may be expected to survive 10,000 or more cycles. Typically, the number of erase pulses, or loops, which are required to complete the erase operation increases (curve 452), while the number of soft programming pulses, or loops, required to complete the soft programming operation decreases (cure 450). The values of $V_{ERASE}$ (see, e.g., FIGS. 7a and 7b) and $V_{SPGM}$ (see, e.g., FIGS. 8a-8f) are typically trimmed during the die sort as predetermined values which are optimal for each device. Normally, $V_{ERASE}$ is trimmed sufficiently high such that the storage elements can be erased with only one erase pulse when the device is fresh. $V_{SPGM}$ is trimmed sufficiently low so that the soft programming requires a certain number of pulses. $V_{ERASE-VERIFY}$ and $V_{SPGM-VERIFY}$ are typically set to predetermined values. The soft programming consumes a significant amount of time when a verify operation is performed after each soft programming pulse. Further, the verify operation may involve separate verification of the storage elements of odd- and even-numbered bit lines, increasing the verify time further. As a result, the performance of the erase sequence is not optimized, especially for low and mid range number of cycles in which a relatively high number of soft program pulses and associated verify pulses are applied.

Figure 5:
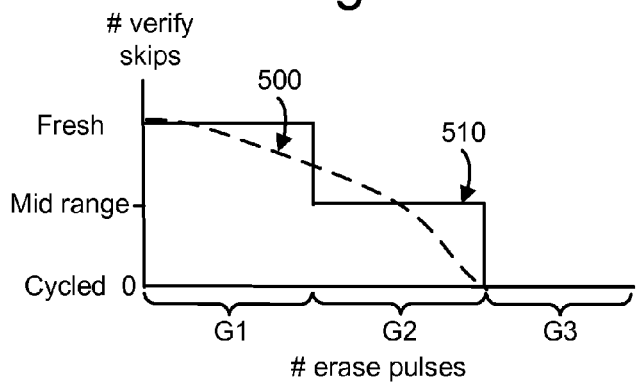
FIG. 5 depicts a relationship of soft programming verify skips to number of erase pulses.

FIG. 5 depicts a relationship of soft programming verify skips to number of erase pulses. The x-axis indicates a number of erase pulses and the y-axis indicates a number of verify skips. To reduce the time consumed by the erase sequence and, particularly, by the soft programming operation, a number of initial verify operations can be skipped based on the number of erase pulses which are used during the erase operation. The number of erase pulses serves as an indicator of the number of cycles of the memory device. However, it is a more accurate indicator of the condition of the device than the number of cycles because it reflects the actual current behavior of the memory device, which may not correlate with an expected behavior based on a cycle count, as different devices with the same or similar cycle count can have different performance. However, it is also possible to use a cycle count.

In particular, curve 500 indicates a relationship of a number of verify skips which may be set as a function of the number of measured erased pulses. Staircase 510 allows the number of erase pulses to be translated to a number of discrete levels of verify skips, such as in three groups G1, G2 and G3. As an example, G1 may represent one erase pulse, which is associated with a first number of verify skips, e.g., ten skips, G2 may represent two to four erase pulses, which are associated with a second number of verify skips, e.g., five skips, and G3 may represent five or six erase pulses, which are associated with a third number of verify skips, e.g., zero skips. Group G1 corresponds to a fresh or early life device, e.g., having a range of 0-c1 cycles, for which a large number of verify skips is appropriate. Group G2 corresponds to a mid range or mid life device, e.g., having a range of c1-c2 cycles, for which a mid range number of verify skips is appropriate. Group G3 corresponds to a cycled or end life device, e.g., having a range of c2-c3 cycles, or above c2 cycles, for which zero or a small number of verify skips is appropriate. The variables c1, 2 and c3 represents numbers which are specific to a device.

It is also possible to associate a number of verify skips with each different number of erase pulses. The memory device can be revised to include the ability to track the number of erase pulses and to maintain a table or formula for associating a number of verify skips with a number of erase pulses. A lookup function can be used to lookup a number of verify skips which correspond to a number of erase pulses. Moreover, a different relationship of: (a) number of verify skips to (b) number of erase pulses can be established for different sets of non-volatile storage elements in a memory device, such as different word lines, blocks, arrays, and planes, e.g., in devices which include multiple levels of storage elements. This is appropriate as the different sets may undergo a different number of cycles and/or have different behaviors even when undergoing a common number of cycles. Or, a common verify skip-to-erase pulse relationship can be established for the entire memory device. Appropriate data structures and control logic can be implemented in a controller memory which is external to the memory chip or on the chip, for instance.

The number of verify skips should be set so that it is as high as possible to result in the greatest time savings, while low enough so that the memory device does not reach the verify level when verify skips are imposed. The optimum number of verify skips can be determined from experimentation, for instance, by correlating the number of erase pulses with the identification of the first soft programming pulse which causes the storage elements to transition past the soft programming verify level, and providing a margin of pulses below that identified pulse. For example, if, for fresh devices, the twelfth soft programming pulse on average causes the storage elements to transition past the soft programming verify level, the number of verify skips may be set to ten, e.g., twelve less a margin of two. A number of memory devices can be tested to obtain statistical metrics such as the standard deviation of the number of the soft programming pulses which cause the storage elements to transition past the soft programming verify level, to set a number of verify skips with a desired level of confidence. This procedure can be repeated for different numbers of erase pulses and cycles to set an optimal number of verify skips accordingly.

Figure 6:
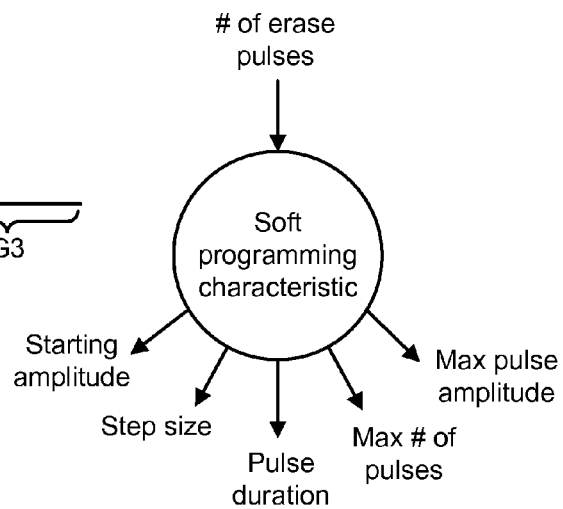
FIG. 6 depicts different soft programming characteristics which can be set based on a number of erase pulses.

FIG. 6 depicts different soft programming characteristics which can be set based on a number of erase pulses. In addition to setting a number of verify skips based on the number of erase pulses, or as an alternative, one or more characteristics of the soft programming operation can be set based on the number of erase pulses. These characteristics include a starting amplitude, such as a voltage $V_{SPGM}$, a step size, a pulse duration, a maximum allowed number of pulses and a maximum pulse amplitude. Regarding the starting amplitude, see FIG. 8d. Regarding the step size, see FIG. 8e. Regarding the pulse duration, see FIG. 8f. Regarding the maximum allowed number of pulses, in one possible implementation, the maximum is lower for a cycled device versus a fresh device since the cycled device should be able to complete the soft programming with fewer soft programming pulses. Regarding the maximum pulse amplitude, in one possible implementation, the maximum is lower for a cycled device versus a fresh device since the cycled device should be able to complete the soft programming with a lower maximum amplitude programming pulse. The pulse amplitude represents an electrical signal of a programming pulse. Note that, generally, programming involves applying signals to a storage element, such as a voltage or current, to change a state of the storage element.

Figure 7A:
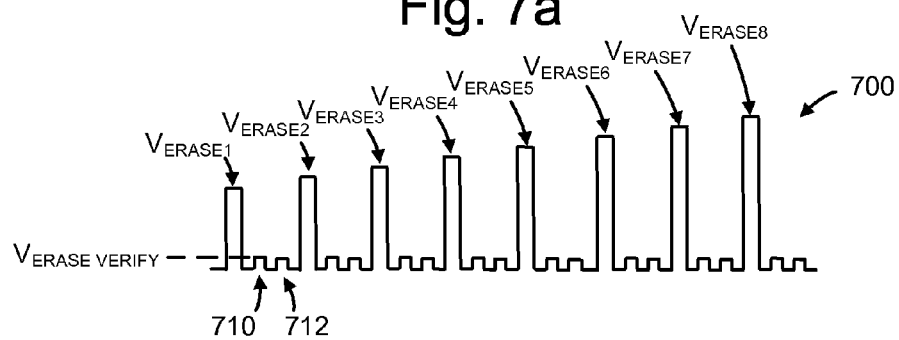
FIG. 7a depicts a series of erase pulses with odd and even verify pulses between adjacent erase pulses.

FIG. 7a depicts a series 700 of erase pulses with odd and even verify pulses between adjacent erase pulses. $V_{ERASE1}$ through $V_{ERASE8}$ represent erase pulses which are applied to the substrate of the memory device during an erase operation, in one example implementation. The erase pulses can increase in amplitude according to a fixed or varying step size, for instance, or they can have a fixed amplitude. Between adjacent erase pulses, separate erase verify pulses for storage elements of odd- and even-numbered bit lines are applied to the control gates of the storage elements. The erase verify pulses have an amplitude of $V_{ERASE\text{-}VERIFY}$. Pulse 710 is an example erase verify pulse for storage elements of odd-numbered bit lines and pulse 712 is an example erase verify pulse for storage elements of even-numbered bit lines.

A verify operation, whether in an erase operation, soft programming operation or regular programming operation, can involve determining whether a storage element is in a conductive state when a voltage or current is applied to the storage element. Depending on a result of the determination, one or more additional pulses are applied. For example, when erase verify pulse 710 is applied, a determination is made as to whether storage elements of odd-numbered bit lines are conductive. If they are conductive, this means their threshold voltage is sufficiently low so that the erase operation has been completed. Similarly, when erase verify pulse 712 is applied, a determination is made as to whether storage elements of even-numbered bit lines are conductive. The application of an erase pulse and the associated verify operation is considered to be an erase loop.

Figure 7B:
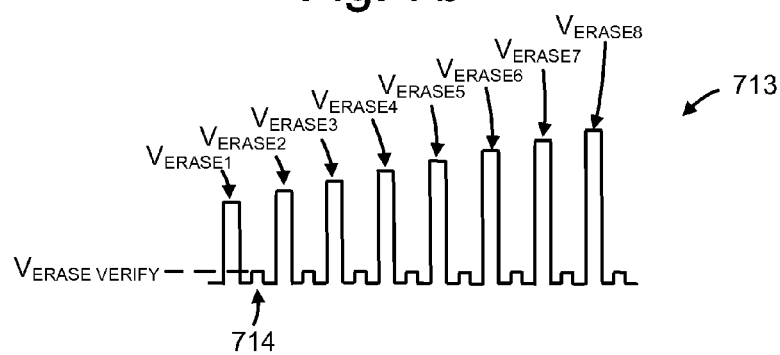
FIG. 7b depicts a series of erase pulses with a single verify pulse between adjacent erase pulses.

FIG. 7b depicts a series 713 of erase pulses with a single verify pulse between adjacent erase pulses. In this case, storage elements of odd- and even-numbered bit lines are verified concurrently, in an all bit line erase verify operation. When example erase verify pulse 714 is applied, a determination is made as to whether storage elements of odd- and even-numbered bit lines are conductive.

Figure 8A:
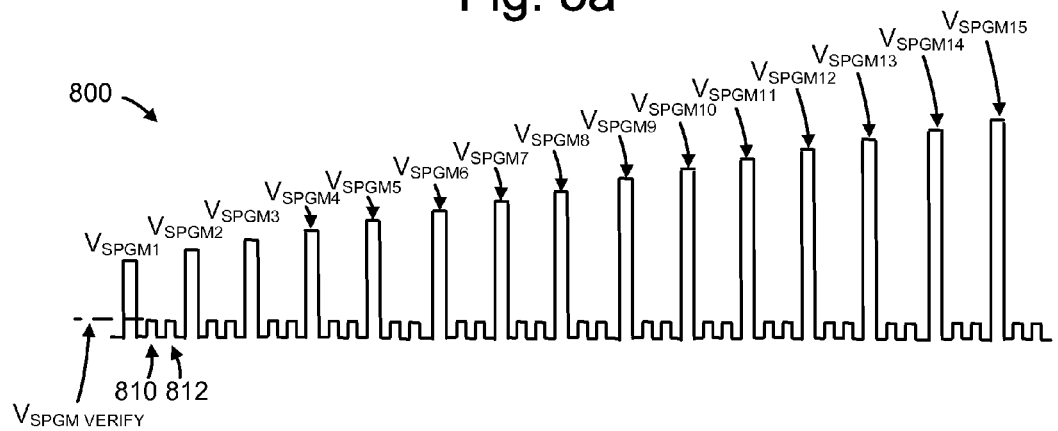
FIG. 8a depicts a series of soft programming pulses with odd and even verify pulses between adjacent soft programming pulses, where no verify operations are skipped, as is appropriate for a cycled device.

FIG. 8a depicts a series of soft programming pulses with odd and even verify pulses between adjacent soft programming pulses, where no verify operations are skipped, as is appropriate for a cycled device. Fifteen soft programming pulses are used as an example. The term "soft" programming indicates that the programming does not change the data state of storage elements, as opposed to "regular" or "hard" programming, which changes the data state. $V_{SPGM1}$ through $V_{SPGM15}$ represent soft programming pulses which are applied to the control gates of the storage elements during a verify operation, in one example implementation. In other case, a current can be applied. The soft programming pulses can increase in amplitude according to a step size, for instance, or they can have a fixed amplitude. Between adjacent soft programming pulses, separate verify pulses for storage elements of odd- and even-numbered bit lines are applied to the storage elements. The erase verify pulses have an amplitude of $V_{SPGM\_VERIFY}$. Pulse 810 is an example soft programming verify pulse for storage elements of odd-numbered bit lines and pulse 812 is an example soft programming verify pulse for storage elements of even-numbered bit lines. Another option is to have only one verify pulse between adjacent soft programming pulses so that storage elements of odd- and even-numbered bit lines are verified concurrently.

In FIG. 8a, there are no verify skips. That is, verify operations are performed after the first soft programming pulses and after each subsequent soft programming pulse. This scenario might be appropriate for a cycled device which has experienced a relatively high number of program-erase cycles. Recall FIG. 5, which indicates that zero verify skips is appropriate for a memory device with a high number of cycles.

Figure 8B:
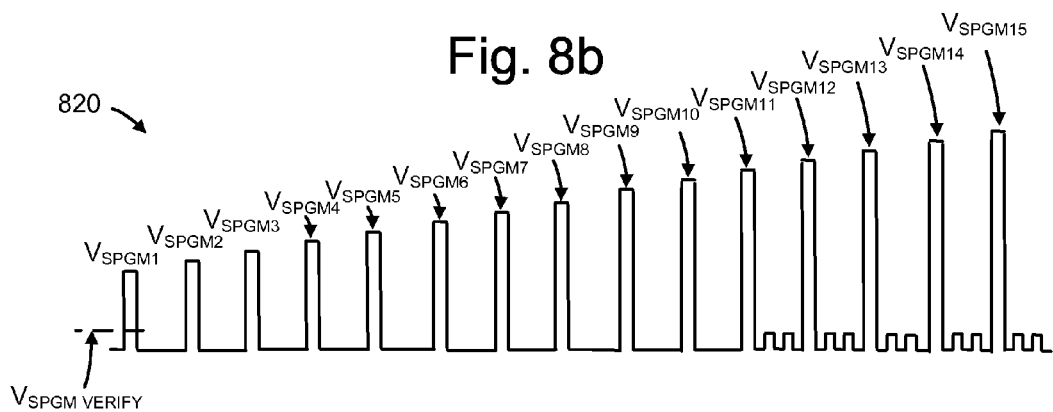
FIG. 8b depicts a series of soft programming pulses where the first ten pulses are not followed by a verify pulse, as is appropriate for a fresh device.

FIG. 8b depicts a series of soft programming pulses where the first ten pulses are not followed by a verify pulse, as is appropriate for a fresh device. Here, there are ten verify skips. The eleventh soft programming pulse ($V_{SPGM11}$) and each subsequent programming pulse are followed by a verify operation. Recall FIG. 5, which indicates that the maximum number of verify skips is appropriate for a fresh memory device. Skipping a significant number of verify operations reduces soft programming time significantly, in addition to reducing power consumption, resulting in better performance.

Figure 8C:
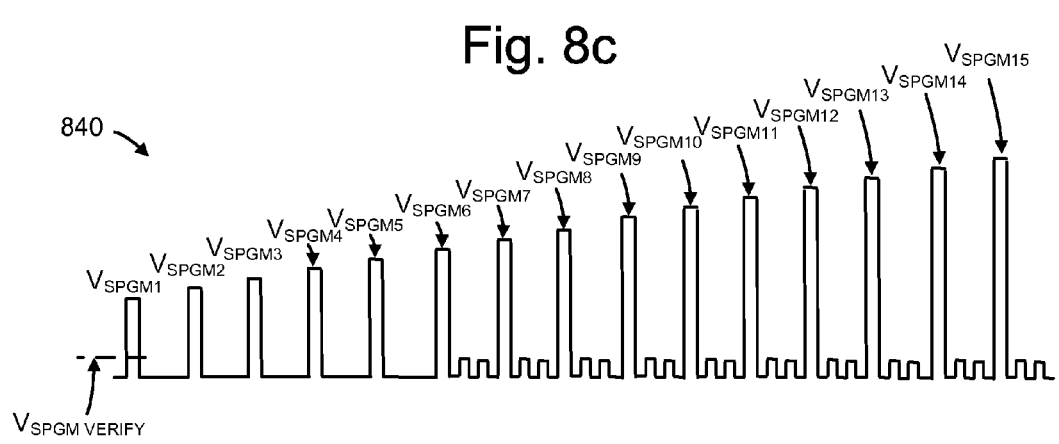
FIG. 8c depicts a series of soft programming pulses where the first five pulses are not followed by a verify pulse, as is appropriate for a mid life device.

FIG. 8c depicts a series of soft programming pulses where the first five pulses are not followed by a verify pulse, as is appropriate for a mid life device. Here, the first five soft programming pulses are not followed by a verify operation, so there are five verify skips. The sixth soft programming pulse ($V_{SPGM6}$) and each subsequent programming pulse are followed by a verify operation. Recall FIG. 5, which indicates that a mid range number of verify skips is appropriate for a memory device having a mid range number of cycles.

Figure 8D:
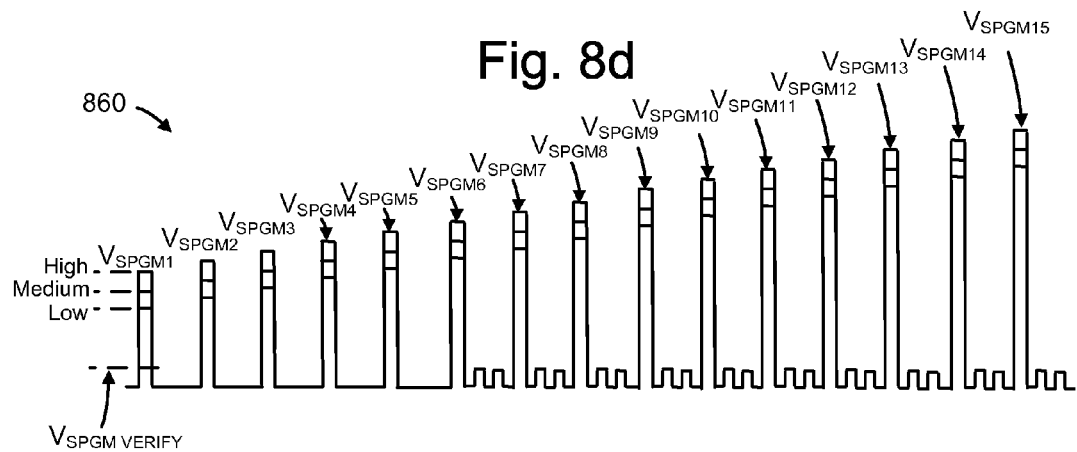
FIG. 8d depicts a series of soft programming pulses having a high, medium or low amplitude, where the first five pulses are not followed by a verify operation.

FIG. 8d depicts a series 860 of soft programming pulses having a high, medium or low amplitude, where the first five pulses are not followed by a verify pulse. As mentioned in connection with FIG. 6, at least one characteristic of a soft programming operation can be set based on the number of erase pulses needed to complete an erase operation. In this example, the characteristic is the amplitude of the soft programming pulses. The amplitude of a first soft programming pulse can be specified along with a step size from which the amplitudes of the remaining pulses can be determined. As the number of cycles increases, a memory device becomes easier to program, so that lower amplitude pulses could be used to complete the soft programming compared to a fresh device. Also, over-programming can be avoided or reduced by using lower amplitude pulses. For example, high, medium, and low amplitudes can be used for a fresh, mid aged and cycled device, respectively. Reducing the soft program pulse amplitude can result in reduced power consumption, while increasing the soft program pulse amplitude can result in faster soft programming. Further, a number of verify skips is also implemented, as an example. As an example, the high, medium, and low amplitudes can be 10 V, 7.5 V and 5 V, respectively.

Figure 8E:
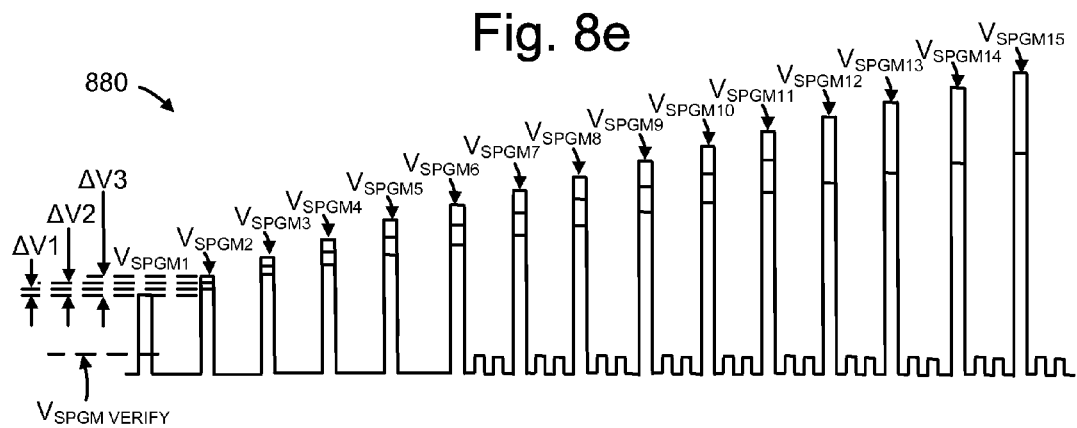
FIG. 8e depicts a series of soft programming pulses with three possible step sizes, where the first five pulses are not followed by a verify operation.

FIG. 8e depicts a series 880 of soft programming pulses with three possible step sizes, where the first five pulses are not followed by a verify pulse. ΔV1, ΔV2 and ΔV3 denote first, second and third step sizes, respectively. A typical step size for soft programming is about 0.2 V, or 0.5 V for the erase operation. In this example, the soft programming characteristic which is set based on the number of erase pulses is the step size of the soft programming pulses. As the number of cycles increases, a memory device becomes easier to program, so that a smaller step size could be used to complete the soft programming compared to a fresh device. For example, high, medium, and low step sizes can be used for a fresh, mid range and cycled device, respectively. Reducing the step size can result in a better programming accuracy and reduced power consumption, while increasing the step size can result in faster soft programming. Further, a number of verify skips is also implemented, as an example.

Figure 8F:
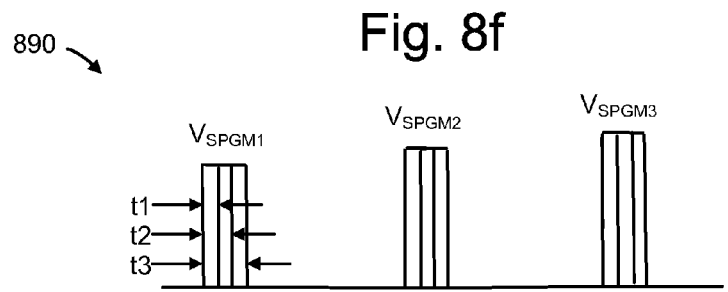
FIG. 8f depicts a series of soft programming pulses with three possible pulse widths.

FIG. 8f depicts a series 890 of soft programming pulses with three possible pulse widths. To show detail, only three pulses are depicted. Time periods t1, t2 and t3 denote first, second and third soft programming pulse widths or durations, respectively. In this example, the soft programming characteristic which is set based on the number of erase pulses is the width of the soft programming pulses. As the number of cycles increases, a memory device becomes easier to program, so that a smaller pulse width could be used to complete the soft programming compared to a fresh device. For example, long, medium and short pulses can be used for a fresh, mid range and cycled device, respectively. Reducing the pulse width can result in reduced power consumption, while increasing the pulse width can result in faster soft programming.

FIG. 9a depicts a method for erasing and programming storage elements, including adjusting a soft programming operation based on a number of erase pulses used in an erase operation. Step 900 includes the start of performing an erase operation. Step 901 includes identifying a number $N_{ERASE}$ of erase pulses used in an erase operation. This is an example of a metric which is based on a count of the erase pulses. Note that this step can be performed for each erase sequence separately, or historical data of one or more previous erase sequences can be used, such as to obtain a rolling average of the number of erase pulses in the last few erase sequences. Step 901 includes optionally categorizing the memory device, or a set of storage elements of the memory device, into one of multiple groups G1, G2 and G3, for instance, based on $N_{ERASE}$. For instance, referring to FIG. 5, a small number of erase pulses may correlate with a fresh device (group G1), a mid range number of erase pulses may correlate with a mid range device (group G2), and a high number of erase pulses may correlate with a cycled device (group G3). Step 903 includes setting a number of soft programming pulses $N_{SPGM\text{-}SKIP}$ to apply without performing a verify operation based on the group (or based directly on $N_{ERASE}$). Step 904 includes setting a soft programming characteristic based on the group (or based directly on $N_{ERASE}$). One or both of steps 903 and 904 may be performed. Further details of steps 900, 905 and 906 are explained in connection with FIG. 9b, FIG. 9c and FIG. 15, respectively.

FIG. 9b depicts a method for performing an erase operation, including counting a number of erase pulses used in an erase operation and setting a number of soft programming verify operations to skip in a subsequent soft programming operation. An erase operation begins at step 910. A counter of the number of erase pulses ($N_{ERASE}$) is set to one at step 912. At decision step 916, if $N_{ERASE}$ is greater than a maximum allowed number of erase pulses, a failure is declared at step 918. If decision step 916 is false, an erase pulse is applied at step 920, and a verify operation is performed at step 922. Recall that the erase verify operation uses $V_{VERIFY\text{-}ERASE}$ from FIG. 3, in one possible implementation. At decision step 924, if the verify is successful, e.g., all or nearly all of the storage elements have passed the verify level $V_{ERASE\ VERIFY}$, the current value of $N_{ERASE}$ is stored at step 926, and the erase operation ends at step 928. Decision step 924 being true represents a first verify condition being satisfied. At decision step 924, if the verify is not successful, $N_{ERASE}$ is incremented at step 914, and a further erase pulse is applied at step 920 as long as the maximum allowed number of erase pulses has not been exceeded at decision step 916.

FIG. 9c depicts a method for performing a soft programming operation by skipping a number of verify operations. The soft programming operation, which begins at step 930, can directly follow the erase operation of FIG. 9b, responsive to completion of the erase operation. Step 932 includes determining the number of soft programming pulses to skip ($N_{SPGM\text{-}SKIP}$) based on $N_{ERASE}$. Note that this step could alternatively be performed in connection with the erase operation, so that $N_{SPGM\text{-}SKIP}$ is stored in memory and retrieved for use in the soft programming operation. In practice, the erase operation and the following soft programming operation are performed as part of an erase sequence and are therefore part of a common process. Optional step 934 includes setting one or more characteristics of the soft programming based on $N_{ERASE}$. Again, this step could alternatively be performed in connection with the erase operation, so that the one or more characteristics are stored in memory and retrieved for use in the soft programming operation.

A counter of the number of soft programming pulses, $N_{SPGM}$, is set to one at step 936. At decision step 940, if $N_{SPGM}$ is greater than a maximum allowed number of soft programming pulses, a failure is declared at step 942. If decision step 940 is false, a soft programming pulse is applied at step 944. At decision step 946, if $N_{SPGM}$ is greater than the number of verify skips, $N_{SPGM\text{-}SKIP}$, a verify operation is performed at step 948. At this point, $N_{SPGM}$ soft programming pulses have previously been applied without performing verify operations. Recall that the soft programming verify operation uses $V_{VERIFY\text{-}SPGM}$ from FIG. 3. At decision step 946, if $N_{SPGM}$ is not greater than the number of verify skips, $N_{SPGM\text{-}SKIP}$, a verify operation is not performed. This means the process is still in a verify skip phase. By not performing verify operations, the soft programming operation can be performed faster. With decision step 946 false, $N_{SPGM}$ is incremented at step 938, and a further soft programming pulse is applied at step 944 as long as the maximum allowed number of soft programming pulses has not been exceeded at decision step 940.

At decision step 950, if the verify is successful, e.g., all or nearly all of the storage elements have passed the verify level $V_{SPGM\ VERIFY}$, the soft programming operation ends at step 952. Subsequently, in a regular or hard programming operation, the storage elements can be programmed to higher data states, e.g., A, B or C. Decision step 950 being true represents a second verify condition being satisfied. At decision step 950, if the verify is not successful, $N_{SPGM}$ is incremented at step 938, and a further soft programming pulse is applied at step 944 as long as the maximum allowed number of soft programming pulses has not been exceeded at decision step 940.

FIG. 10a depicts a method for determining a number of verify operations to skip in an erase operation. It was discussed above that the soft programming time can be reduced by skipping soft programming verify operations when they are not necessary, as a function of the detected behavior of the memory device which can be determined by the number of erase pulses needed to complete a prior erase operation. Similarly, the erase operation time can be reduced by not performing erase verify operations when they are not necessary. This can be done alone or together with the above-mentioned techniques for reducing soft programming time and/or adjusting characteristics of the soft programming based on a device's current behavior. In an example process, step 1000 includes identifying a number of pulses used in multiple erase operations. Step 1002 includes calculating the average number of erase pulses used in each operation, $N_{ERASE\text{-}AVG}$. Step 1004 includes setting a number of erase pulses to apply in a next erase operation without performing a verify operation as $N_{ERASE\text{-}SKIP} = N_{ERASE\text{-}AVG} - N_{MARGIN}$. For example, $N_{MARGIN}$ can be one or two pulses. As an example, a cycled device may require an average of four erase pulses, and $N_{MARGIN}$ may be set as one pulse, in which case $N_{ERASE\text{-}SKIP} = 4 - 1 = 3$. Note that $N_{ERASE-SKIP}$ could also be set based on one prior erase operation rather than an average, mean or other metric from multiple prior erase operations.

As future devices are expected to use a larger number of erase pulses, e.g., up to eight to fifteen erase pulses, the time savings from skipping erase verify operations can be significant. Power consumption is also reduced.

FIG. 10b depicts a method for performing an erase operation by skipping a number of verify operations. The process can be performed in conjunction with that of FIG. 10a. The erase operation begins at step 1010. A counter of the number of erase pulses ($N_{ERASE}$) is set to one at step 1012. At decision step 1016, if $N_{ERASE}$ is greater than a maximum allowed number of erase pulses, a failure is declared at step 1018. If decision step 1016 is false, an erase pulse is applied at step 1020. At decision step 1022, if $N_{ERASE}$ is greater than the number of erase verify skips, $N_{ERASE-SKIP}$, a verify operation is performed at step 1024. At this point, $N_{ERASE}$ erase pulses have previously been applied without performing verify operations. Recall that the erase verify operation uses $V_{VERIFY-ERASE}$ from FIG. 3. At decision step 1022, if $N_{ERASE}$ is not greater than $N_{ERASE-SKIP}$, a verify operation is not performed. This means the process is still in a verify skip phase. By not performing verify operations, the erase operation can be performed faster.

With decision step 1022 being false, $N_{ERASE}$ is incremented at step 1014 and a further erase pulse is applied at step 1020 as long as the maximum allowed number of erase pulses has not been exceeded at decision step 1016. At decision step 1026, if the verify is successful, the erase operation ends at step 1028. At decision step 1026, if the verify is not successful, $N_{ERASE}$ is incremented at step 1014 and a further erase pulse is applied at step 1020 as long as the maximum allowed number of erase pulses has not been exceeded at decision step 1016.

Note that the processes of FIGS. 9b and 10b can be combined to reduce the erase operation time as well as to determine the number of erase pulses used and the appropriate number of soft programming verify skips.

The techniques described above can be used in connection with a NAND memory device as discussed below in further detail, in one possible implementation.

FIG. 10c depicts a series of erase pulses 1030 where the first three pulses are not followed by a verify pulse. A first erase verify pulse 1032 occurs after the fourth erase pulse $V_{ERASE4}$ and after each successive erase pulse in the series 1030, as an example.

FIG. 11 illustrates an example of an array 1100 of NAND storage elements, such as those shown in FIGS. 1a and 1b. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
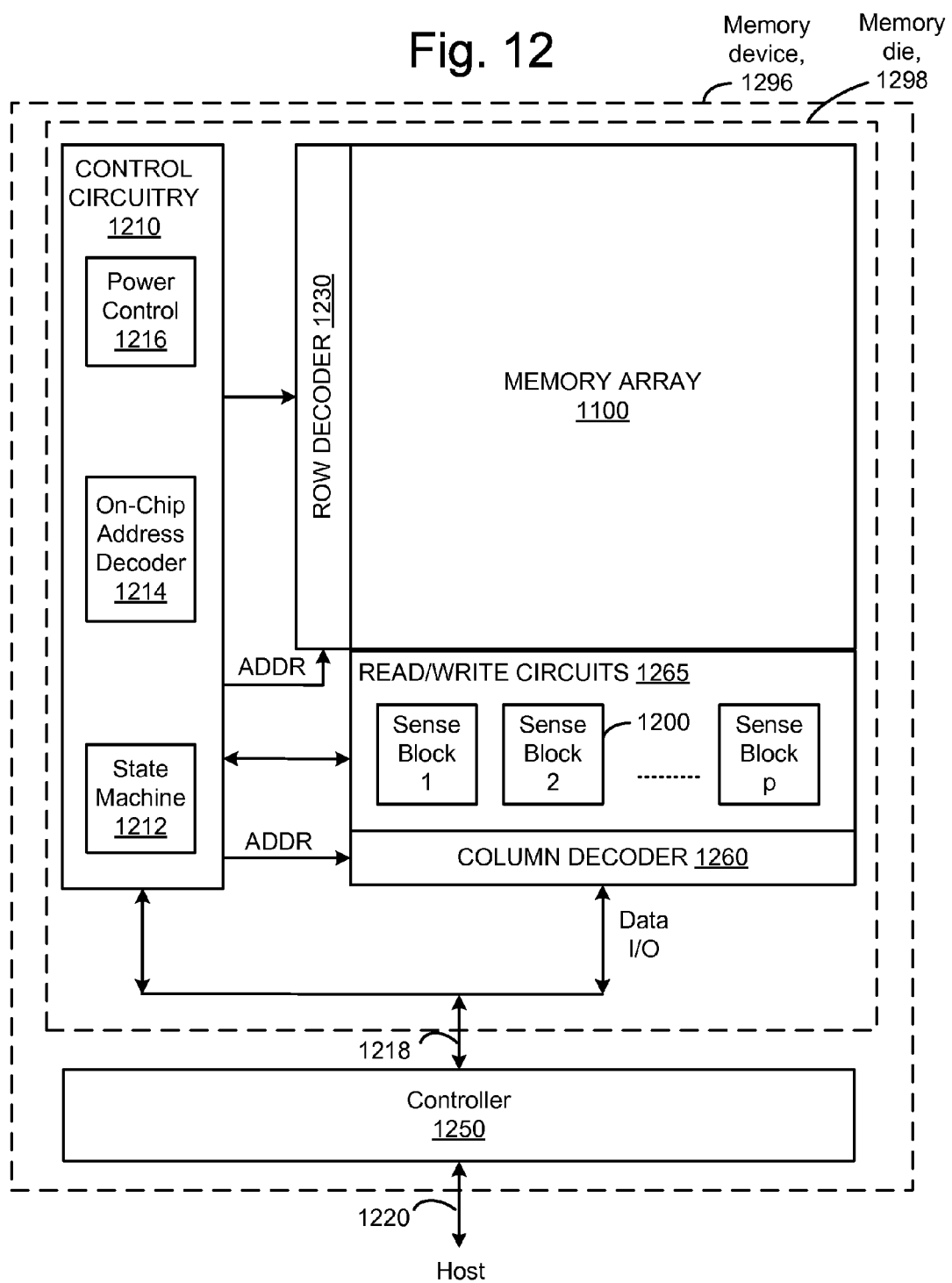
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214, and a power control module 1216. The state machine 1212 provides chip-level control of memory operations, including controlling pre-charging. The on-chip address decoder 1214 provides an address interface between that used by the host or a memory controller to the hardware address used by the decoders 1230 and 1260. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, etc.

As mentioned, appropriate data structures and control logic can be implemented in a controller memory which is external to the memory chip or on the chip, for instance.

In another approach, dual row/column decoders and read/write circuits are used. Access to the memory array 1100 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 1100. In this way, the density of the read/write modules is essentially reduced by one half.

Figure 13:
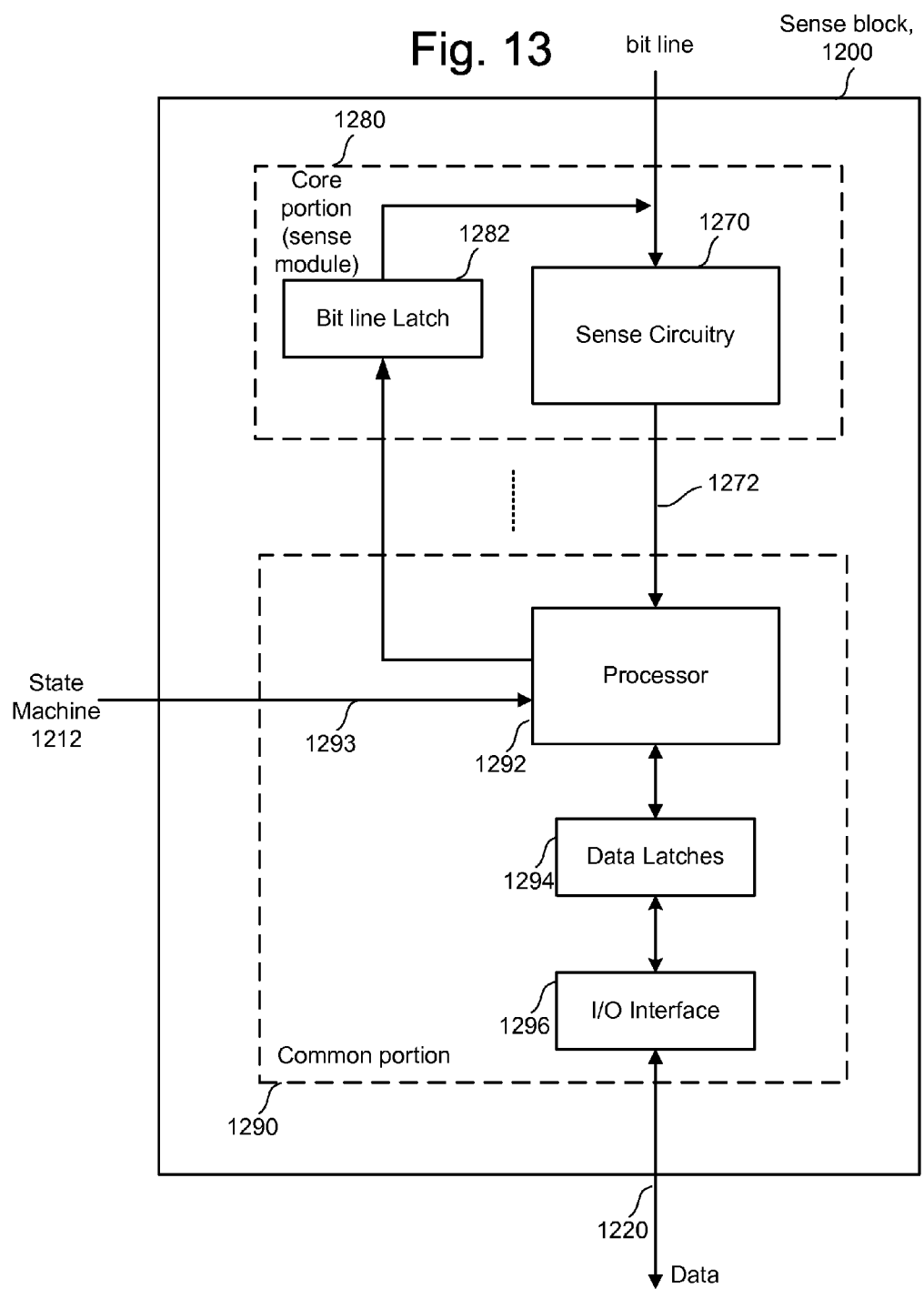
FIG. 13 is a block diagram depicting one embodiment of a sense block.

FIG. 13 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 14:
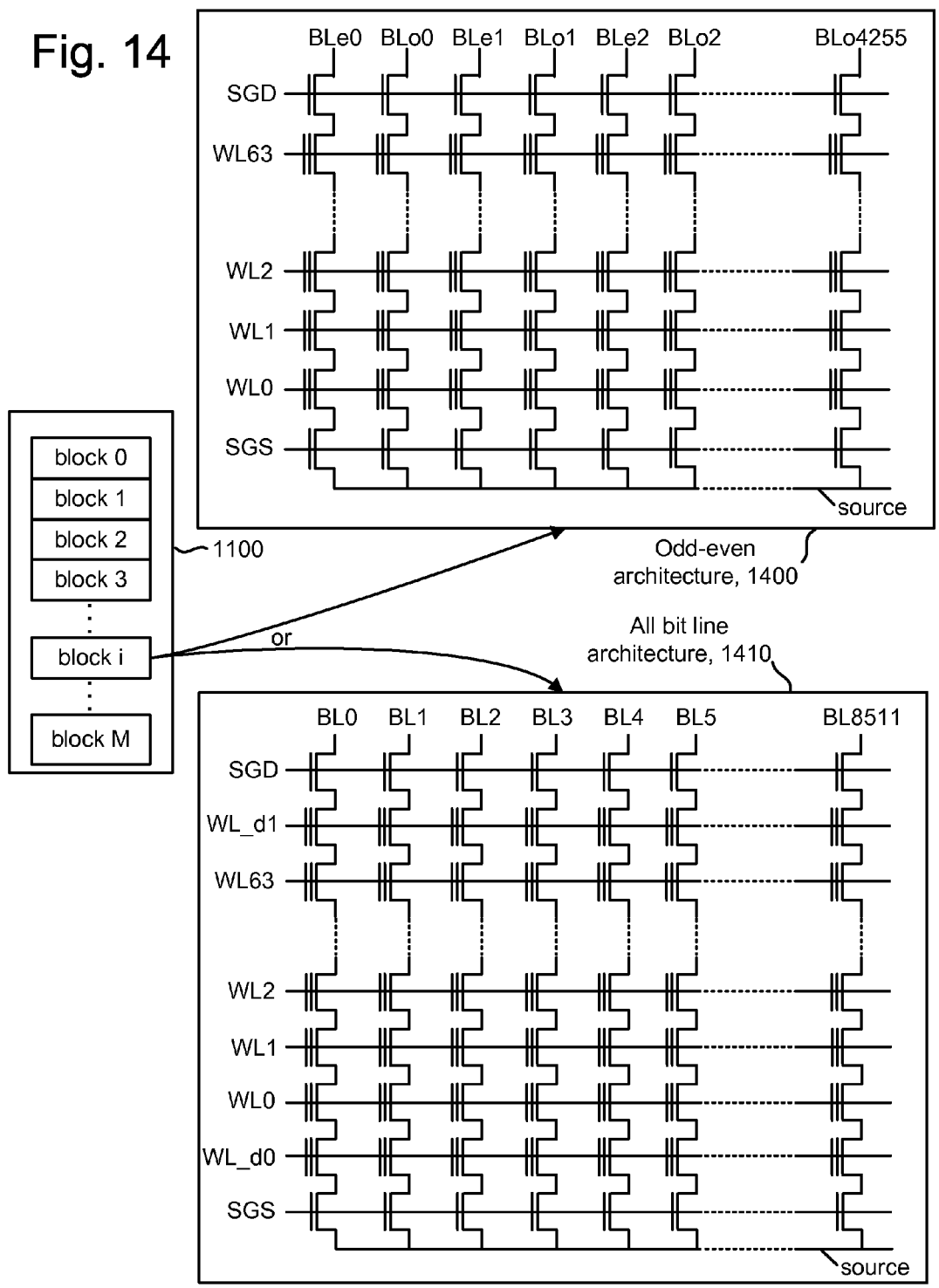
FIG. 14 illustrates an example of an organization of a memory array into blocks for an all bit line memory architecture and for an odd-even memory architecture.

FIG. 14 illustrates an example of an organization of a memory array into blocks for an all bit line memory architecture and for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1410), all the bit lines of a block can be simultaneously selected during read and program operations.

Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1400), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

Figure 15:
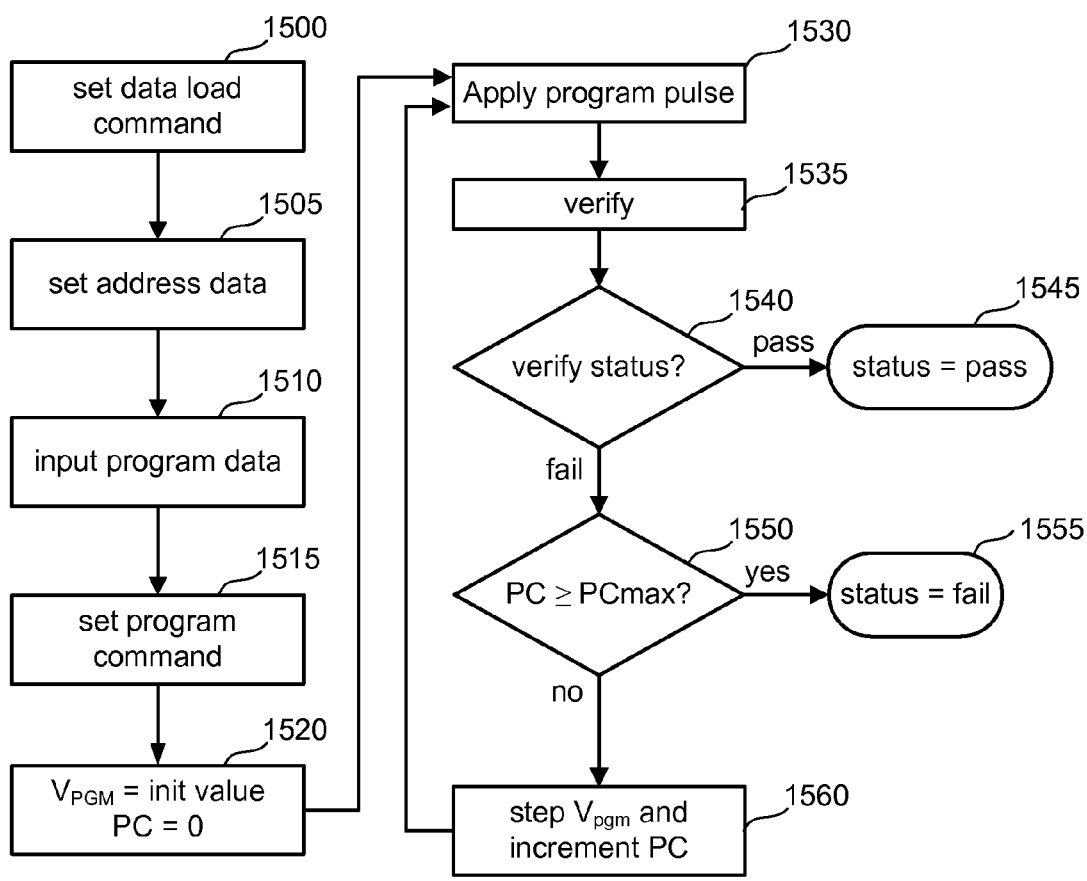
FIG. 15 is a flow chart describing one embodiment of a process for programming non-volatile memory.

FIG. 15 is a flow chart describing one embodiment of a method for programming non-volatile memory. As mentioned, after an erase sequence has been completed, programming to higher data states, above the erased state, can occur. In one implementation, storage elements are erased (in blocks or other units) prior to programming. In step 1500, a "data load" command is issued by the controller and input received by control circuitry 1210 (see FIG. 12). In step 1505, address data designating the page address is input to decoder 1214 from the controller or host. In step 1510, a page of program data for the addressed page is input to a data buffer for programming. That data is latched in the appropriate set of latches. In step 1515, a "program" command is issued by the controller to state machine 1212.

Triggered by the "program" command, the data latched in step 1510 will be programmed into the selected storage elements controlled by state machine 1212 using stepped program pulses applied to the appropriate selected word line. In step 1520, the program voltage, $V_{PGM}$, is initialized to the starting pulse (e.g., 12 V or other value) and a program counter (PC) maintained by state machine 1212 is initialized at zero. At step 1530, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1535, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1540, a check is made as to whether all of the data latches are storing logic "1." If all of the data latches are storing logic "1," the programming process is complete and successful because all selected storage elements were programmed and verified. A status of "PASS" is reported in step 1545. In some embodiments, the programming process is considered complete and successful even if not all selected storage elements were verified as being programmed. In such a case, errors during subsequent read operations can occur due to insufficient programmed storage elements. However, these errors can be corrected by ECC.

If, in step 1540, it is determined that not all of the data latches are storing logic "1," then the programming process continues. In some embodiments, the program process stops even if not all of the data latches are storing logic "1". In step 1550, the program counter PC is checked against a program limit value PCmax. One example of a program limit value is twenty; however, other numbers can also be used. If the program counter PC is not less than PCmax, then the program process has failed and a status of "FAIL" is reported in step 1555. If the program counter PC is less than PCmax, then $V_{PGM}$ is increased by the step size and the program counter PC is incremented in step 1560. The process then loops back to step 1530 to apply the next $V_{PGM}$ pulse.

Figure 16A:
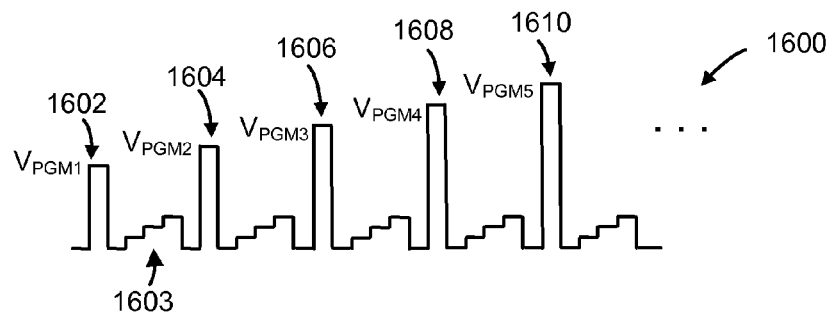
FIG. 16a depicts an example pulse train applied to the control gates of non-volatile storage elements during programming, where verify operations are performed concurrently for storage elements of odd and even bit lines.

FIG. 16*a* depicts an example pulse train applied to the control gates of non-volatile storage elements during programming, where verify operations are performed concurrently for odd and even bit lines. The pulse train 1600 includes a series of program pulses 1602, 1604, 1606, 1608, 1610, ..., that are applied to a word line selected for programming. In one embodiment, the programming pulses have a voltage, $V_{PGM1}$, which starts at 12 V and increases by increments, e.g., 0.5 V, for each successive programming pulse until a maximum of, e.g., 20-25 V is reached. In between the program pulses are verify pulses, e.g., three verify pulses. In some embodiments, there can be a verify pulse for each state that data is being programmed into, e.g., state A, B and C. In other embodiments, there can be more or fewer verify pulses. The verify pulses in each set can have amplitudes of $V_{VERIFY-A}$, $V_{VERIFY-B}$ and $V_{VERIFY-C}$ (FIG. 3) for instance. An example set of verify pulses 1603 is applied to storage elements of both odd- and even-numbered bit lines.

Figure 16B:
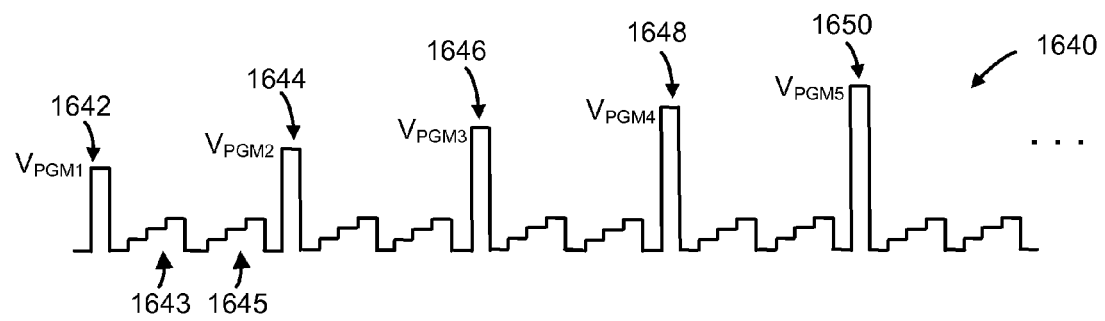
FIG. 16b depicts an example pulse train applied to the control gates of non-volatile storage elements during programming, where verify operations are performed separately for storage elements of odd and even bit lines.

FIG. 16*b* depicts an example pulse train applied to the control gates of non-volatile storage elements during programming, where verify operations are performed separately for odd and even bit lines. The pulse train 1640 includes a series of program pulses 1642, 1644, 1646, 1648, 1650, ..., that are applied to a word line selected for programming. An example set of verify pulses 1643 is applied to storage elements of odd-numbered bit lines, and an example set of verify pulses 1645 is applied to storage elements of even-numbered bit lines.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
applying one or more erase pulses to a set of non-volatile storage elements until a first verify condition is satisfied;
determining a count of the erase pulses applied; and
applying a number $N_{SPGM-SKIP}$ of one or more soft programming pulses to the set of non-volatile storage elements without performing verify operations, $N_{SPGM-SKIP}$ is based on the count, and subsequently applying one or more additional soft programming pulses to the set of non-volatile storage elements until a second verify condition is satisfied, each soft programming pulse of the one or more additional soft programming pulses is followed by a verify operation.

2. The method of claim 1, further comprising:
categorizing the set of non-volatile storage elements into one group of multiple available groups based on the count, where $N_{SPGM-SKIP}$ is based on the group into which the set of non-volatile storage elements is categorized.

3. The method of claim 1, further comprising:
responsive to the second verify condition being satisfied, programming at least one of the non-volatile storage elements in the set to a higher data state.

4. The method of claim 1, wherein:
$N_{SPGM-SKIP}$ is based on a count of erase pulses applied in multiple erase operations.

5. The method of claim 1, wherein:
the set of non-volatile storage elements has a first threshold voltage distribution which is below an erased state, at least in part, when the first verify condition is satisfied, and a second, tighter threshold voltage distribution at the erased state when the second verify condition is satisfied.

6. The method of claim 1, wherein:
the applying one or more erase pulses is part of an erase operation of a first erase sequence, and the applying the number $N_{SPGM-SKIP}$ of one or more soft programming pulses is part of a soft programming operation of the first erase sequence.

7. The method of claim 6, further comprising:
performing an additional erase operation of a second erase sequence in which a number of erase verify pulses is skipped based on the count.

8. A method for operating non-volatile storage, comprising:
performing an erase operation of an erase sequence, including applying one or more erase pulses to a set of non-volatile storage elements until an erase verify condition is satisfied;
determining a count of the erase pulses applied; and
performing a soft programming operation of the erase sequence, including applying one or more soft programming pulses to the set of non-volatile storage elements until a soft programming verify condition is satisfied, a characteristic of the one or more soft programming pulses is set based on the count.

9. The method of claim 8, wherein:
the characteristic comprises a level of a first soft programming pulse of the one or more soft programming pulses.

10. The method of claim 8, wherein:
the characteristic comprises a step size of the one or more soft programming pulses.

11. The method of claim 8, wherein:
the characteristic comprises a maximum limit on a number of the one or more soft programming pulses.

12. The method of claim 8, wherein:
the characteristic comprises a limit of an energy of the one or more soft programming pulses.

13. The method of claim 8, wherein:
the characteristic comprises a pulse width of the one or more soft programming pulses.

14. The method of claim 8, further comprising:
performing a programming operation which involves a transition between data states for at least one of the non-volatile storage elements, responsive to completion of the soft programming operation.

15. The method of claim 8, wherein:
the applying one or more soft programming pulses comprises applying a number N $N_{SPGM-SKIP}$ SKIP of one or more soft programming pulses without performing verify operations, the number $N_{SPGM-SKIP}$ is based on the count, and subsequently applying one or more additional soft programming pulses, each soft programming pulse of the one or more additional soft programming pulses is followed by a verify operation.

16. A non-volatile storage apparatus, comprising:
a set of non-volatile storage elements; and
at least one control circuit, the at least one control circuit applies one or more erase pulses to the set of non-volatile storage elements until a first verify condition is satisfied, determines a count of the erase pulses applied, and applies a number Nspgm-skip of one or more soft programming pulses to the set of non-volatile storage elements without performing verify operations, Nspgm-skip is based on the count, and subsequently applies one or more additional soft programming pulses to the set of non-volatile storage elements until a second verify condition is satisfied, each soft programming pulse of the one or more additional soft programming pulses is followed by a verify operation.

17. The non-volatile storage apparatus of claim 16, wherein:
the at least one control circuit categorizes the set of non-volatile storage elements into one group of multiple available groups based on the count, where Nspgm-skip is based on the group into which the set of non-volatile storage elements is categorized.

18. The non-volatile storage apparatus of claim 16, wherein:
the applying one or more erase pulses is part of an erase operation of a first erase sequence, and the applying the number Nspgm-skip of one or more soft programming pulses is part of a soft programming operation of the first erase sequence.

19. The non-volatile storage apparatus of claim 16, wherein:
at least one of a level, step size and pulse width of at least one of the one or more soft programming pulses is set based on the count.

20. The non-volatile storage apparatus of claim 16, wherein:
the one or more erase pulses are applied as part of an erase operation of a first erase sequence, and the number Nspgm-skip of one or more soft programming pulses are applied as part of a soft programming operation of the first erase sequence; and
the at least one control circuit performs an additional erase operation of a second erase sequence in which a number of erase verify pulses is skipped based on the count.

* * * * *